United States Patent [19]

Correale

[11] Patent Number: 4,880,754

[45] Date of Patent: Nov. 14, 1989

[54] METHOD FOR PROVIDING ENGINEERING CHANGES TO LSI PLAS

[75] Inventor: Anthony Correale, Lake Katrine, N.Y.

[73] Assignee: International Business Machines Corp., Armonk, N.Y.

[21] Appl. No.: 69,915

[22] Filed: Jul. 6, 1987

[51] Int. Cl.$^4$ .................. H01L 21/20; H01L 21/00
[52] U.S. Cl. ........................ 437/51; 148/DIG. 104; 148/DIG. 143; 357/45; 437/36; 437/48
[58] Field of Search .......... 148/DIG. 102, DIG. 104, 148/DIG. 109, DIG. 143, DIG. 164; 364/200, 716, 900; 307/465, 463; 357/23.12, 40, 45, 46, 51; 437/36, 93, 47, 48, 51, 54, 60, 8

[56] References Cited

U.S. PATENT DOCUMENTS

| | | | |
|---|---|---|---|
| 3,312,871 | 4/1967 | Seki et al. | 357/45 |
| 3,475,621 | 10/1969 | Weinberger | 357/40 |
| 3,484,932 | 12/1969 | Cook, Jr. | 437/54 |
| 3,558,992 | 1/1971 | Heuner et al. | 357/48 |
| 3,598,604 | 8/1971 | De Puy | 437/8 |
| 3,618,201 | 11/1971 | Makimoto et al. | 437/8 |
| 3,633,268 | 1/1972 | Engbert | 437/8 |
| 3,771,217 | 11/1973 | Hartman | 437/8 |
| 3,795,972 | 3/1974 | Calhoun | 437/8 |
| 3,936,812 | 2/1976 | Cox et al. | 364/716 |
| 3,983,619 | 10/1976 | Kubo et al. | 437/51 |
| 3,999,214 | 12/1976 | Cass | 357/68 |
| 4,177,452 | 12/1979 | Balasubramanian et al. | 307/468 |
| 4,240,094 | 12/1980 | Mader | 437/173 |
| 4,268,708 | 5/1981 | Logue et al. | 364/716 |
| 4,295,149 | 10/1981 | Balyoz et al. | 357/51 |
| 4,468,735 | 8/1984 | Götze et al. | 364/716 |
| 4,506,341 | 3/1985 | Kalter et al. | 307/465 |

OTHER PUBLICATIONS

Cook et al., "Laser–Latch Redundancy Implementation", IBM Tech. Dis. Bul., vol. 17, No. 1, Jun. 1974, pp. 243-244.

Primary Examiner—Brian E. Hearn
Assistant Examiner—William Bunch
Attorney, Agent, or Firm—Joscelyn G. Cockburn

[57] ABSTRACT

A method for providing engineering changes to LSI PLAs. One or more additional input lines, output lines, and/or product terms are provided in the overall mask set, however, logically unconnected to the rest of the PLA, which is designed to provide the desired PLA function. The additional lines and terms are provided so as to be able to be connected to the PLA, and provide additional personalization by changes to the contact mask and masks for subsequent process steps to contact. The invention may be incorporated in an existing PLA macro assembler system. By simply redefining certain cells the additional devices may be incorporated through those redefined individual cells. Thus, the invention is relatively easy to retrofit to existing PLA macro assembler systems.

4 Claims, 6 Drawing Sheets

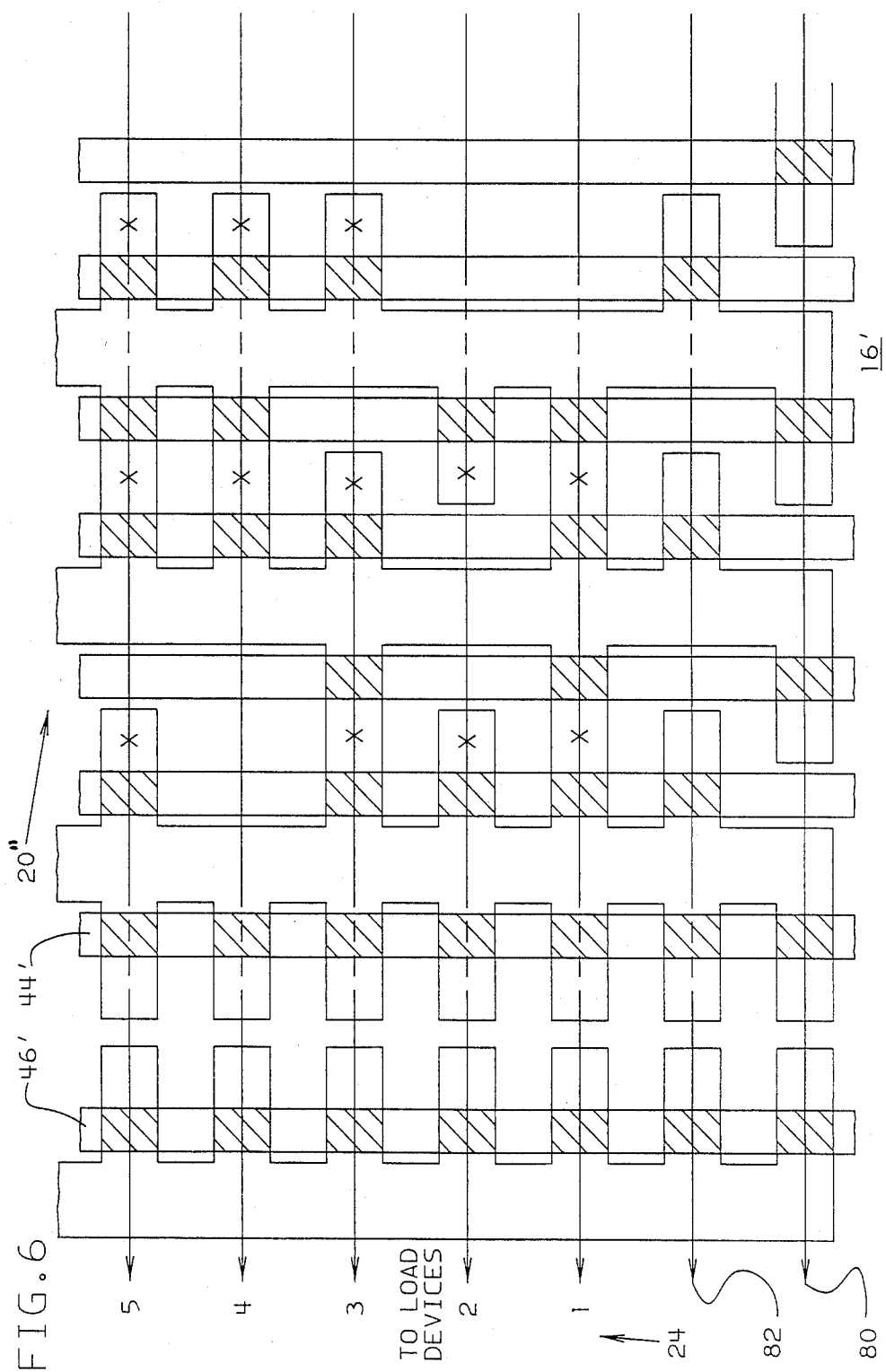

//4,880,754//

METHOD FOR PROVIDING ENGINEERING CHANGES TO LSI PLAS

BACKGROUND OF THE INVENTION

1. Field of the Invention

The present invention relates to the design and fabrication of large scale integrated circuits including program logic array structures, and more particularly relates to a method for facilitating engineering changes during the fabrication thereof.

2. Background Art

PLAs incorporated on advanced custom LSI and VLSI semiconductor chips are designed in general for control logic implementations. This area of the overall logic design is the most susceptible to change. In the past, even minor changes, such as the addition of a single device to alter the personalization of the AND array, required a nearly complete rebuild of all process masks and, as such, resulted in large scrap costs and long lead times until the introduction of the engineering change ("EC"). The requirement for an additional input or product term causes a great deal of chip rework, and requires a completely new mask set.

It is therefore an object of the present invention to provide a method for fabricating LSI chips incorporating PLAs that do not require a completely new mask set for an engineering change.

SUMMARY OF THE INVENTION

Accordingly, the present invention provides a method for fabricating and subsequently changing a large scale integrated ("LSI") circuit chip that incorporates an electronic circuit including a programmed logic array ("PLA") wherein a set of masks is provided, including masks for contact and subsequent fabrication steps such as metallization, so designed to realize the electronic circuit in the LSI chip. Images are provided in the mask set for at least one additional product term, input line or output line, the additional product term and lines being logically isolated from the PLA. The chip is fabricated from this set of masks. Then, as desired to effect changes in the chip, the images in the masks for contacts and subsequent fabrication steps are changed to connect one or more of the other input or output lines to one or more of the additional input or output lines, as the case may be, or the additional product term is connected to one or more input lines and one or more output lines, all to realize the addition or subtraction of devices comprising array personalization to effect the desired circuit changes. A chip is then fabricated with the changed set of masks.

The use of supplemental inputs, product terms and outputs in the initial PLA definition can allow for the incorporation of PLA ECs without the need for a complete mask set rebuilt, thereby reducing manufacturing time to implement the EC, and greatly reduce scrap cost. The actual implementation of this supplemental logic can be tailored to satisfy the individual designer's best estimate of potential change, e.g. how many inputs, product terms and outputs.

BRIEF DESCRIPTION OF THE DRAWINGS

FIG. 6 is a diagram of a portion of the OR array part of the PLA array shown in FIG. 1.

DETAILED DESCRIPTION OF THE PREFERRED EMBODIMENT

Figure 1:
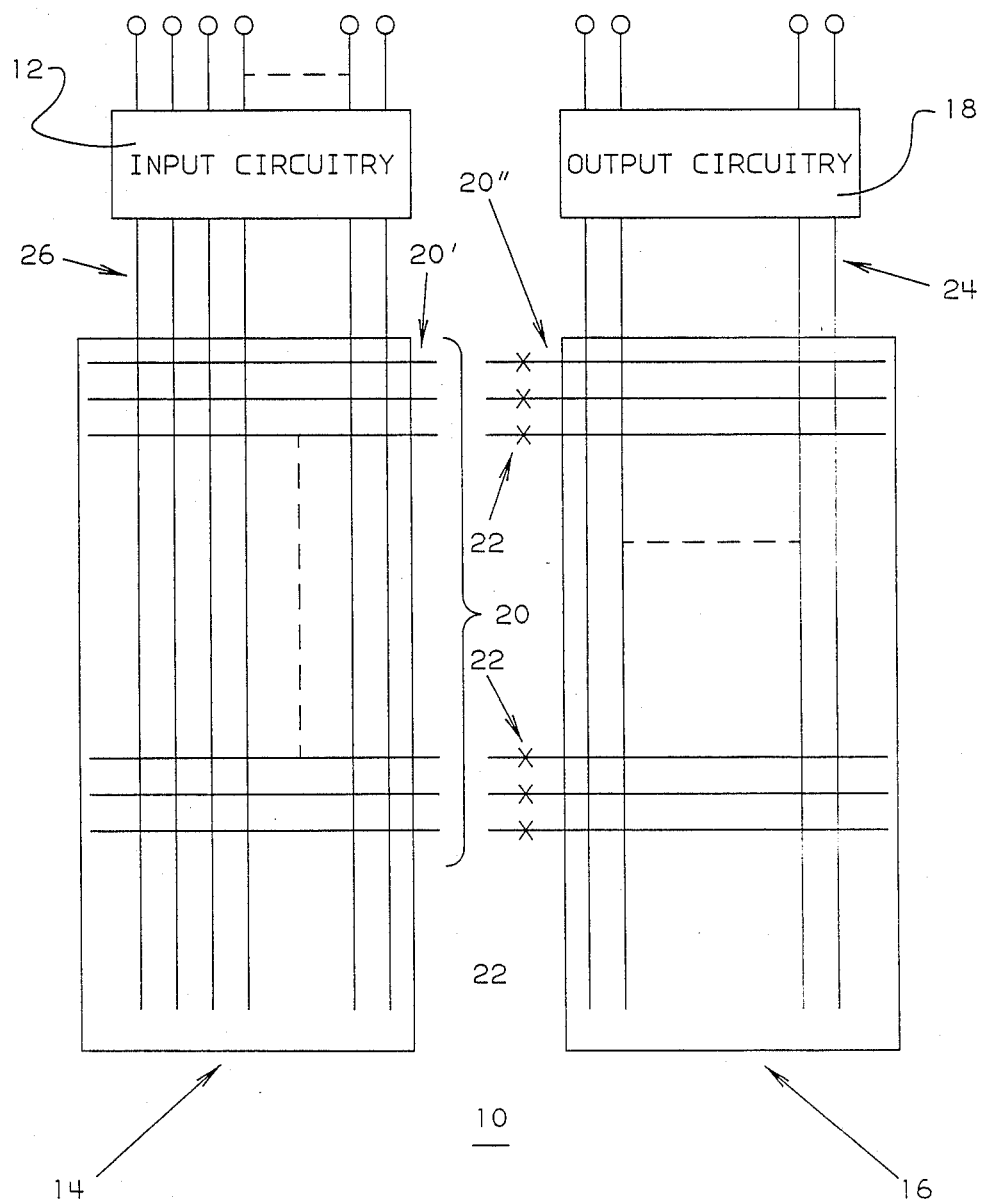
FIG. 1 is a diagram showing a typical PLA.

FIG. 1 illustrates a typical PLA physical realization 10. As can be seen, the circuit includes input circuitry 12, and AND array 14, OR array 16, and output circuitry 18. The product terms 20 that run horizontally through and between AND array 14 and OR array 16 are comprised of metal one lines 20' in AND array 14, and polysilicon lines 20" in OR array 16. They are connected at junction points 22, depicted by x's in FIG. 1. Output lines 24 are comprised of metal, while input lines 26 are comprised of polysilicon, in this embodiment.

It should be noted that any input circuitry arrangement can be used, such as direct, inverted, true/complement, etc. Also, while the preferred embodiment described herein is an AND-OR PLA, other organization types can be used as well, such as AND-OR AND, OR-AND, etc.

Figure 2:
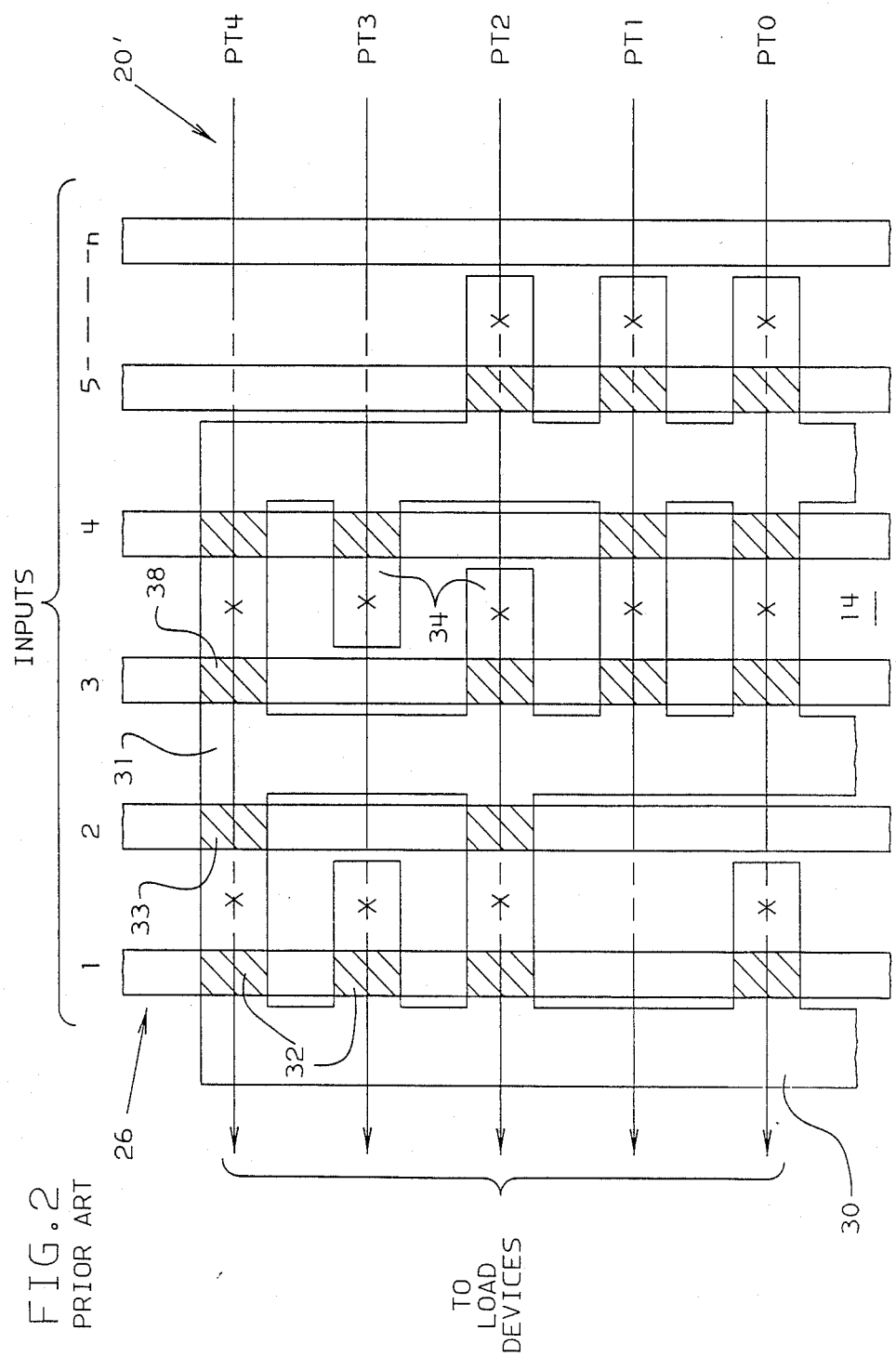
FIG. 2 is a diagram showing a polysilicon, contact and metallization one layers of a portion of a semiconductor LSI chip, showing a portion of a PLA therein.

FIG. 2 illustrates the physical layout of a portion of AND array 14 (FIG. 1). Of the n input terms 26, the personalization for the first five of these terms is shown. There is no particular significance to the personalization shown in the drawing; an arbitrary personalization is used simply for illustrative purposes.

As can be seen, the vertical stripes representing input terms 26 are, as mentioned above, comprised of polysilicon. The area identified by reference character 30 is a diffusion layer used to create the drains and sources of FET transistors. In this diagram, for example, area 31 is an area of diffusion comprising a shared source, which is electrically connected to ground through a contact to metal connection (not shown). Individual device personalizations are represented by cross hatch areas 32. Thus, the two devices 33, 38 share the source 31, along with other devices formed by inputs 2 and 3. Contact connections between the portion of diffusion 30 comprising drains, and product terms 20' are illustrated by x's 34.

It should be noted that the term diffusion as it is used herein is not limited to the diffusion processes. Any process that provides an impurity implant, for example diffusion, ion implantation, etc., can be used to form such region.

The product terms (PT) 20' are connected to load devices (not shown) which would appear to the left of the figure, as is conventional.

Figure 3:
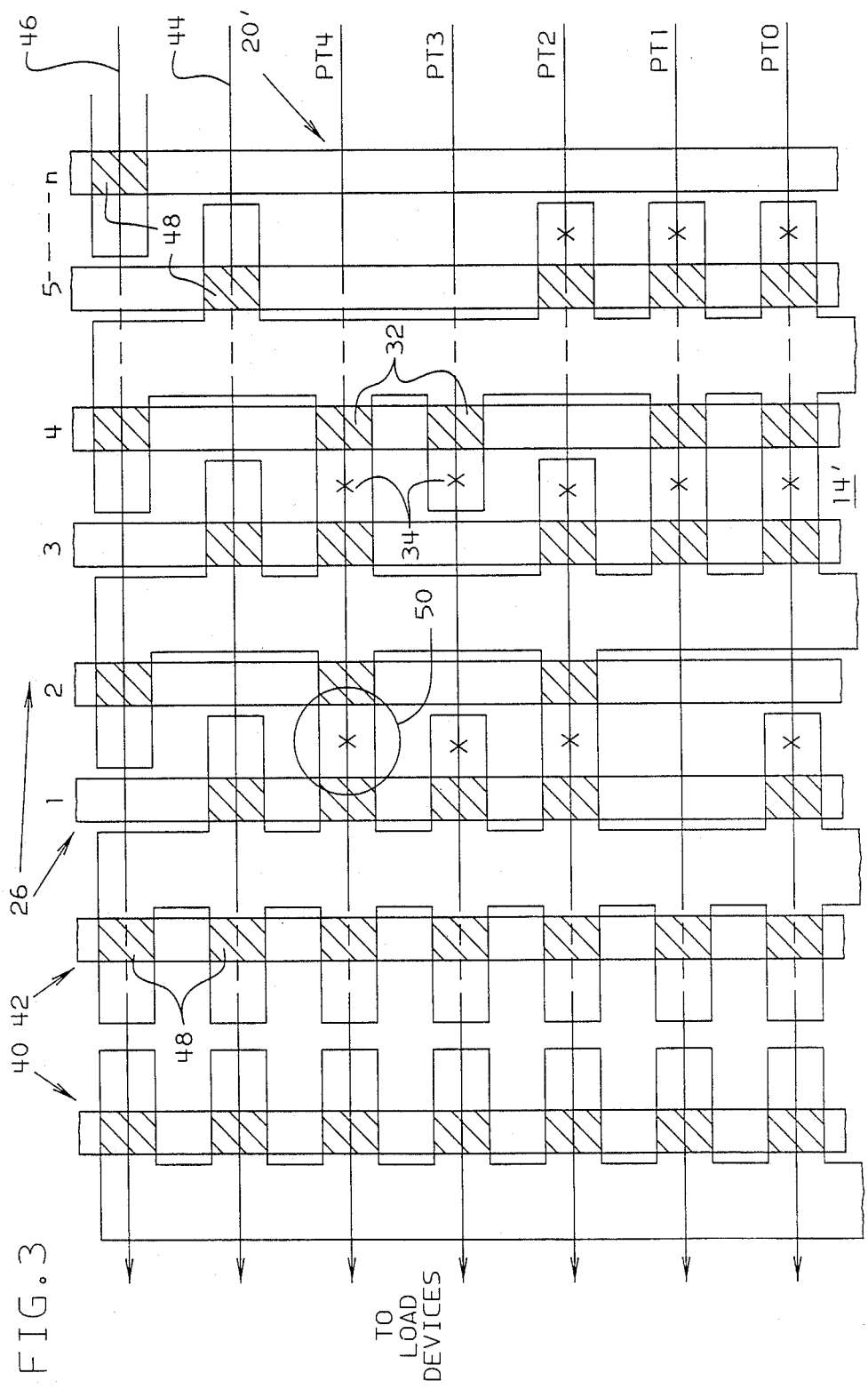
FIG. 3 is a diagram like that of FIG. 2, showing two additional input lines and two additional product terms incorporated according to the principles of the present invention.

FIG. 3 illustrates the physical layout of the AND array 14 shown in FIG. 2, with the incorporation of two supplemental inputs 40, 42, and two supplement product terms 44, 46, denoted by reference numeral 14'. Supplemental device personalization regions 48 are shown by way of cross hatching, as can be seen.

Note that the supplemental inputs 40, 42, are 100% personalized, that is each input is potentially device connected to each product term 20', 44, 46. However, the supplemental product terms 44, 46, are only 50% personalized, so that the additional products terms 44, 46, can be connected to single input terms 26 without having to connect to an adjacent neighbor input line as well. Note that the non-supplemental device region is a conventional compacted form. Thus, adjacent device connections may be made with a single contact point, as shown in the region identified by reference numeral 50. It is because this compacted form is used that only every other device can be personalized for the supplemental product terms 44, 46.

In the preferred embodiment the supplemental inputs 40, 42, are tied to ground to a connection not shown in the figure to eliminate floating gates and the resultant potential for static electricity damage in later stages of fabrication. These lines could be tied to VDD as well, or in the judgement of the circuit designer, left floating should it be determined that the risk of such damage is low.

Notice also that the supplemental product terms 44, 46 are at the top of the array, close to the input circuitry 12 (FIG. 1). This avoids forcing all inputs 26 to run the entire length of the product term array, even if not connected to product terms 20' that appear at the bottom of the array.

The supplemental input terms 40, 42, appear on the left hand side of the array, closest to the load devices (not shown). This is a design consideration which permitted the modification of a pre-existing PLA macro-assembler to incorporate the preferred embodiment of the present invention in an easy manner. The pre-existing macro-assembler was modified such that the load device cell definition was changed to include not only the previous load device but also the supplemental inputs. A similar change was made to the definition of the transition cell to incorporate not only the previous transition cell but also the supplemental output, as is discussed below. The simple modifications to the assembler were relatively easy to make, and required no change to the existing structure of the assembler.

Note that the drains of the devices connected to the supplemental inputs 40, 42, are floating. That is, in the diagram, no X's are shown, indicating the contact to metal.

Figure 4:
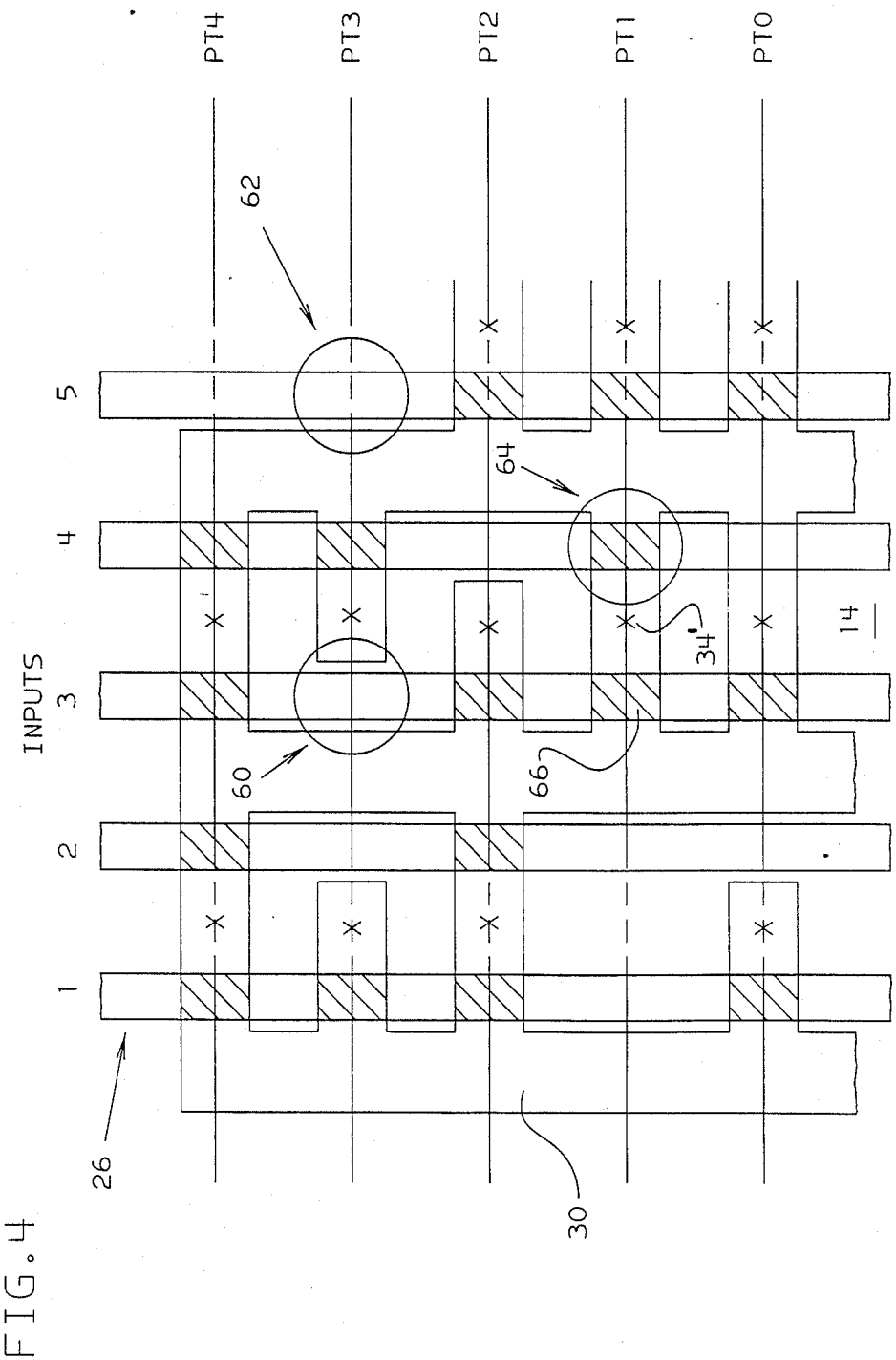
FIG. 4 is a diagram identical to FIG. 2, showing desired engineering changes to be effected in accordance with the principles of the present invention.

FIG. 4 shows the same portion of prior art AND array 14 shown in FIG. 2, having desired engineering changes depicted. It is desired to add devices at locations 60 and 62, and to delete a device at location 64. Note that the device at 64 is connected to product term PT1 by way of contact 34' which also connects device 66 to the same product term.

Figure 5:
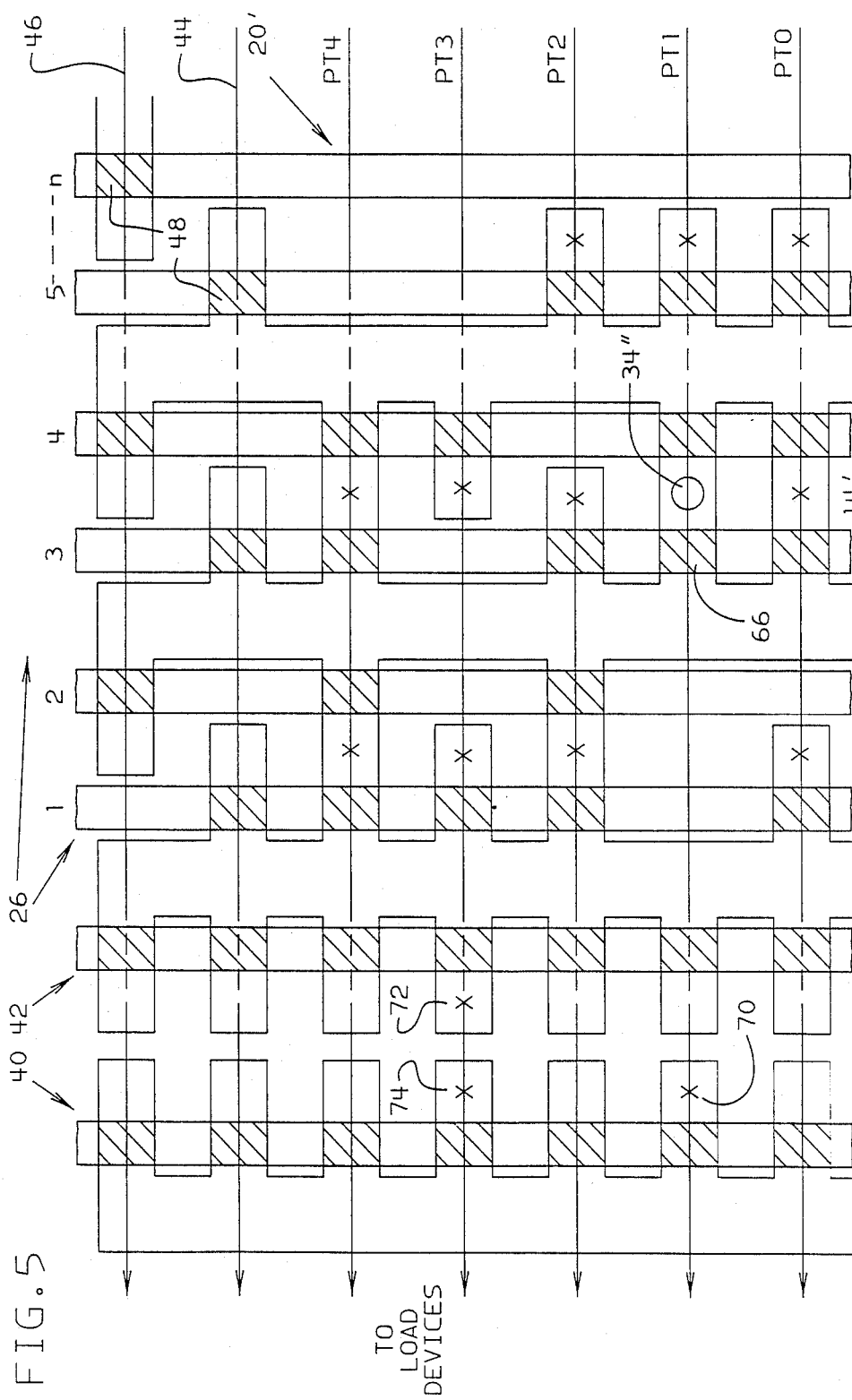
FIG. 5 is a diagram like FIG. 3, showing the necessary changes to the appropriate layers of the chip to effect the changes identified in FIG. 4.

FIG. 5 is a diagram of that portion of PLA AND gate 14' shown in FIG. 3, showing the actual EC implementation using the supplemental inputs 40, 42. In this case, supplemental input 40 is connected to input #3 external to the PLA at the input to the PLA buffers. This connection is realized by modifying the metal to tie the supplemental inputs from its non-use state (tie-up/down, depending upon input buffer scheme use) to its desired location: in this case input #3. It is important to realize that no sub-contact process masks need to be modified to implement the change. Note also that connections are made at the input to the PLA buffers. This was considered desirable from the standpoint of electrical compatibility. This will depend upon the particular circuit configurations involved in the input circuitry, under a matter of obvious design choice by one skilled in the art. In any event, the important thing is for logical connection by way of an electrically compatible connection.

Supplemental input 42 is likewise connected to input #3 in the same manner. The masks other than contacts and metal defined in the original mask data are not modified to realize the change. The area where contact 34' (FIG. 4) has been removed is identified by a reference numeral 34" in FIG. 5. As mentioned above, device 66 is also removed thereby. The removal of device 66 is corrected by placing a contact 70 in the location defined by the intersection of product term 1 and supplemental input 40, which will be recalled was previously connected to input #3.

In addition the contact structure is also placed at location 72, defined by the intersection of product term #3 and supplemental input 42. This realizes the additional device desired to be connected to input 5, identified as region 62 in FIG. 4.

Finally, a contact is placed at location 74 defined by the intersection of product term #3 and supplemental input 40, to realize the second additional device identified by region 60 in FIG. 4.

Note that a further advantage provided by the preferred embodiment of the invention is that, for example, the supplemental inputs 40, 42, could also have been connected to other global chip nets to enhance the PLA overall function. For example, a reset line could be brought in to de-gate the entire array. This assumes the availability of this line to be nearby or brought to the array without modifying anything other than masks later in the process sequence than contact structures, to preserve the advantage provided by the present invention.

It should also be noted that the use of two supplemental product terms, 44, 46, allows any personalization of devices from the existing inputs as well as the supplemental inputs to form a single unique product term. Recall that it was necessary to have only 50% personalization of the supplemental product terms 44, 46, due to the compaction arrangement of the original PLA. For this reason, both supplement product terms 44, 46 are needed to be utilized to obtain a single unique product term which requires adjacent input bit personalization. The two supplemental product terms 44, 46, also must be shorted together electrically, and one load device metallization one layer connection broken to form a single product term to avoid overloading the respective load devices. Alternatively, the OR array personalization could be modified to form the dot AND, as is discussed below. In either case a great deal of flexibility is available.

FIG. 6 is a diagram showing a portion of a modified OR array 16' incorporating the polysilicon extensions of both the pre-existing product terms 20" as well as of the additional product terms 44', 46'. The pre-existing output terms 24 are shown, as are supplemental output terms 80, 82. All output terms are metallization. The principles regarding modification, explained above in connection with FIGS. 2-5, apply analogously to the OR array as well.

The present invention can be applied in other technologies, such as CMOS, NMOS and PMOS FET technologies, bipolar technologies, etc. The area penalty associated with this implementation depends upon the extent to which the supplemental concept is applied, the layout ground rules used, and the number of inputs, outputs and product terms defining the original PLA function. The area overhead for this approach can be as little as 5% of the total PLA area. There should also be little or no performance degradation associated with this implementation. The preferred embodiment of the present invention was applied to several PLAs, having twenty to forty inputs, twenty to sixty outputs, and from ten to one hundred product terms. In all cases two additional inputs, outputs, and product terms were used.

As mentioned above, the overall area penalty for the total LSI design should be less than 5%. This is considered to be a small price to pay in semiconductor area to realize significant EC-ability, without the need for complete mask redesign, long manufacturing times to implement, and potentially reduced scrap cost associated with the product in process.

While the invention has been described with reference to preferred embodiments thereof, it will be understood by those skilled in the art that various changes in form or details may be made without departing from the scope of the invention. Some of these changes have been described above, for example that the concept can be applied to other technologies and other PLA organizations. Other changes are possible as well, and considerations of the scope of the invention should be made primarily with reference to the appended claims.

We claim:

1. A method for fabricating and subsequently changing a Large Scale Integrated (LSI) circuit chip that incorporates an electronic circuit including a Programmed Logic Array (PLA) comprising the steps of:
   (a) providing a set of masks including masks for contact and metallization, designed to realize said electronic circuit in said LSI chip;
   (b) providing, in said set of masks an area with a first set of images for defining the PLA and a second set of images being disposed adjacent to the first set of images with said second set of images being logically and physically isolated from said first set of images and including images for at least one additional product term, input line, or output line, and devices
   (c) fabricating said chip from said set of masks;
   (d) as desired to effect changes to said chip, changing the images in said masks for contacts and subsequent fabrication steps only to connect one or more of other input or output lines of said PLA to one or more of said additional input or output lines, as the case may be, or connect said additional product term to one or more input lines and one or more output lines, to realize the addition or subtraction of the devices comprising array personalization to effect said desired circuit changes; and
   (e) fabricating said chip with said changed set of masks.

2. A method for fabricating and subsequently changing an LSI chip according to claim 1, wherein said step of providing images is performed by providing, in said set of masks, images for at least two additional product terms, two additional input lines and two additional output lines, said additional product terms and lines being logically isolated from said PLA.

3. A method for fabricating and subsequently changing an LSI chip according to claim 2, wherein said PLA has a compact configuration permitting adjacent term connections to be provided by way of a single contact, and wherein said step of providing images is performed by providing said additional product terms with devices for potential connection to every other input line and every other output line.

4. A method for fabricating and subsequently changing an LSI chip according to claim 1,
   wherein said step of providing a set of masks is performed by providing data input to a macro assembler corresponding to said electronic circuit; and
   wherein said step of providing images is performed by redefining one or more cells of the PLA so as to provide for the additional potential device connections that comprise the additional product term, input line or output line, as the case may be, electrically isolated from said PLA.

* * * * *